United States Patent
Vogt et al.

(10) Patent No.: US 9,054,263 B2
(45) Date of Patent: Jun. 9, 2015

(54) DRYING APPARATUS AND DRYING METHOD FOR SOLAR MODULES

(75) Inventors: Achim Vogt, Freiburg (DE); Karl Friedrich Haarburger, Freiburg (DE); Alexander Hakenjos, Kandern (DE); Tomas Nunez, Freiburg (DE)

(73) Assignee: Concentrix Solar GmbH, Frieburg (DE)

(*) Notice: Subject to any disclaimer, the term of this patent is extended or adjusted under 35 U.S.C. 154(b) by 1227 days.

(21) Appl. No.: 12/995,451

(22) PCT Filed: May 28, 2009

(86) PCT No.: PCT/EP2009/003829
§ 371 (c)(1),
(2), (4) Date: Mar. 18, 2011

(87) PCT Pub. No.: WO2009/144025
PCT Pub. Date: Dec. 3, 2009

(65) Prior Publication Data
US 2011/0154683 A1    Jun. 30, 2011

(30) Foreign Application Priority Data
May 30, 2008 (DE) .......................... 10 2008 025 958

(51) Int. Cl.
*F26B 3/02* (2006.01)
*H01L 31/18* (2006.01)

(52) U.S. Cl.
CPC ............ *H01L 31/18* (2013.01); *B01D 2257/80* (2013.01); *Y02E 10/52* (2013.01)

(58) Field of Classification Search
None
See application file for complete search history.

(56) References Cited

U.S. PATENT DOCUMENTS

| | | | |
|---|---|---|---|
| 3,181,286 A * | 5/1965 | Parks ............................ | 96/113 |
| 4,341,539 A | 7/1982 | Gidaspow et al. | |
| 4,522,637 A * | 6/1985 | Becker ............................ | 95/96 |
| 4,636,225 A * | 1/1987 | Klein et al. .................... | 95/120 |
| 4,698,073 A * | 10/1987 | Rohde et al. .................. | 95/123 |
| 5,022,930 A | 6/1991 | Ackerman et al. | |
| 5,746,807 A * | 5/1998 | Thelen et al. ................. | 95/123 |
| 5,846,295 A * | 12/1998 | Kalbassi et al. .............. | 95/105 |
| 6,201,179 B1 | 3/2001 | Dalacu | |
| 7,145,629 B2 | 12/2006 | Nakano | |
| 2003/0218751 A1 | 11/2003 | Nakamura | |
| 2006/0065117 A1* | 3/2006 | Jain .............................. | 95/52 |
| 2007/0251569 A1 | 11/2007 | Shan et al. | |

FOREIGN PATENT DOCUMENTS

| | | |
|---|---|---|
| DE | 4420587 | 10/1995 |
| EP | 382937 B1 | 8/1990 |
| EP | 0788171 A2 | 8/1997 |
| WO | WO-2007/087343 A | 8/2007 |

OTHER PUBLICATIONS

Chinese Examination Report for Chinese Patent Application No. 200980119308.5.

* cited by examiner

*Primary Examiner* — Christopher P Jones
(74) *Attorney, Agent, or Firm* — Dorsey & Whitney LLP

(57) ABSTRACT

The present disclosure relates to an apparatus and a method of drying the interior of solar modules. The apparatus and the method are particularly suitable for use with concentrator photovoltaic (CPV) modules. The drying apparatus comprises an absorber for drying and a heating device for heating a gas flowing therethrough and is connected to a solar cell via a connection, so that the dried gas is conducted into the solar cell.

15 Claims, 1 Drawing Sheet

DRYING APPARATUS AND DRYING METHOD FOR SOLAR MODULES

CROSS-REFERENCE OF PRIOR APPLICATION

The present application claims priority from International Patent Application No. PCT/EP2009/003829 filed May 28, 2009, and from German Patent Serial No. 10 28 025 958.6 filed May 30, 2008, the disclosures of which are incorporated herein by reference their entireties.

TECHNICAL FIELD OF THE DISCLOSURE

The present disclosure relates to a drying device for a solar module.

BACKGROUND

The present invention relates to an apparatus and a method for drying the interior of solar modules. The apparatus and the method are particularly suitable for concentrator photovoltaic (CPV) modules.

In concentrator photovoltaic modules, light irradiated by the sun is normally concentrated through lenses onto solar cells having a comparatively small surface. The solar cells are arranged on the bottom panel of a module and interconnected, whereas the lenses are arranged on a lens plate extending parallel to the bottom panel. Each solar cell has associated therewith a lens which concentrates light incident thereon onto the respective solar cell. In this connection, it is important that the distance between the lens plate and the bottom panel is maintained as precisely as possible, since defocusing would result in a deterioration of the efficiency of the solar cell module.

In principle, it would be desirable to maintain solar modules as hermetically sealed as possible so as to prevent the solar cells and the electric components in the module from being damaged by environmental influences. The situation is, however, such that the temperature of the solar cell module is under incident solar radiation much higher than would be the case without incident solar radiation. This has the effect that the internal pressure of the solar module varies strongly in accordance with the temperature-dependent expansion of the air contained in the solar module, and this would lead to a curvature of the lens plate if the module were sealed. Such a curvature would impair the focusing and, consequently, the efficiency of the module. In order to avoid such impairment, an exchange of gas is allowed between the interior of the module and the surroundings so that, if the gas should expand due to a rise in temperature, it can escape from the module. On the other hand, gas can flow into the module, when the temperature drops.

The problem arising in this connection is that, in the long run, the solar cells and electric components arranged in the solar module will be damaged by the humidity and harmful substances introduced in the solar module by the incoming air. There is a need for an apparatus and a method that can be used for removing harmful substances and moisture from a solar module and for drying the solar module.

SUMMARY

An embodiment of the disclosure is a solar module drying apparatus. The apparatus can include an absorber configured for drying a gas and having an inlet and an outlet for the gas flowing therethrough. A heating device can be provided, configured for heating the gas passing through the absorber for drying the absorber. A solar module connection configured for connecting to a solar module and directing the dried gas from the absorber to the solar module. Preferably, the heating device has an inlet and an outlet for the gas flowing therethrough, the outlet of the absorber is in gas-conducting communication with the connection, and the outlet of the heating device is in gas-conducting communication with the inlet of the absorber.

The drying device outlet can be connected downstream of the absorber outlet and upstream of the connector and configured for releasing the gas from the drying apparatus to the exterior. Additionally, an outlet valve member can be connected with the absorber outlet and configured for selectively directing the gas from the absorber to the drying device outlet. The outlet valve member can include a first valve disposed between the absorber and the outlet, and a second valve disposed between the branch and the connection for controlling the flow of gas from the connection.

Preferably, the drying apparatus has a bypass conduit connected for directing the gas to the inlet of the absorber, bypassing the heating device. The bypass valve member can be connected for controlling the flow of gas through the bypass conduit. Also, the bypass valve member can include a third valve disposed for controlling the flow of gas through the bypass conduit, and a fourth valve disposed upstream of the inlet of the heating element and configured for controlling the flow of gas into the heating element. A drying device outlet is preferably connected downstream of the absorber outlet and upstream of the connector and is configured for releasing the gas from the drying apparatus to the exterior. An outlet valve member is preferably connected with the absorber outlet and configured for selectively directing the gas from the absorber to the drying device outlet. Additionally, a controller is preferably associated with the valve members for alternately operating the valve members in first and second modes. In the first mode, the valve members are adapted to direct the gas through the bypass conduit, the absorber, and the connector for flushing the solar module with air dried by the absorber. In the second mode, the valve members are adapted to direct the gas through the heating device, the absorber, and the drying device outlet, for regenerating the absorber.

In one embodiment, a gas moving device is configured for propelling the gas through the drying device. Also, dust filter can be connected at an inlet into the drying device or the drying device outlet.

The heating device can include, for example, a solar thermal collector, a vacuum collector tube, or an electric heater. The heating device can be provided in series with, of on the absorber. An embodiment of the absorber contains silica gel for drying the gas. Also, in an embodiment, the connector is connected to the solar module for directing the gas thereinto, and an embodiment of a solar module system includes the drying apparatus and the solar module connected to the connector for receiving the dried gas from the absorber.

In a preferred method of drying a solar module gas having a first temperature is conducted through an absorber, in which the gas is dried, into the solar module. Subsequently, a gas is heated in a heating device to a second temperature that is higher than the first temperature, and the heated gas is directed through the absorber to heat and dry the absorber. The heating element used can be a solar thermal collector, a vacuum collector tube, or an electric heater, for example. The gas can be heated to the second temperature by an electric heater arranged on the absorber or by solar radiation incident on the absorber, for example. The gas can be conducted through a dust filter prior to or subsequent to flowing through the absorber or the heating element. Preferably, the gas used is air.

BRIEF DESCRIPTION OF THE DRAWINGS

While the specification concludes with claims particularly pointing out and distinctly claiming the subject matter that is regarded as forming the various embodiments of the present disclosure, it is believed that the embodiments will be better understood from the following description taken in conjunction with the accompanying Figures, in which:

DETAILED DESCRIPTION

Figure 1:
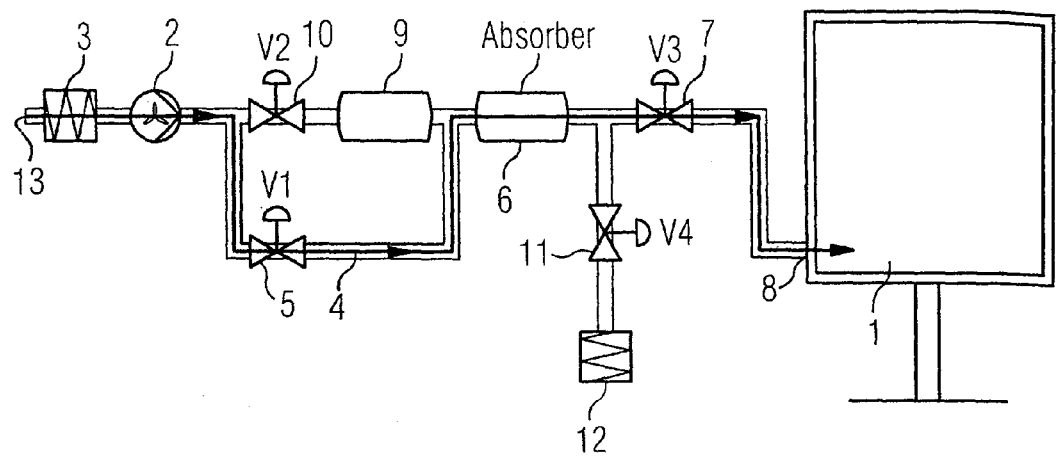
FIG. 1 shows a drying apparatus according to the present invention during flushing of a solar module with dried air.

The present disclosure provides an apparatus and a method that can be used for removing harmful substances and moisture from a solar module and for drying the solar module. The preferred embodiment allows the flushing the solar module regularly, e.g. after sunset, with dried and/or filtered air. Due to the flushing with dried air, the level of relative humidity will be kept low in the module. The service life of the electric components arranged in the module, such as solar cells, diodes and connecting wires, will be increased substantially in this way, and this will also lead to a substantial increase in the useful life of the solar module. This results in a reduction of costs per unit energy generated, and the durations of guarantee can be extended.

Such flushing of a solar module with dry air can be effected by a drying apparatus that has an absorber, by means of which gas, preferably air, flowing therethrough can be dried. For example, for flushing a module with dried air, air can be conducted through the absorber and into the module. The module can be coupled to the drying apparatus via a connection.

In order to help maintain the drying apparatus in good working order, the absorber preferably is regularly regenerated and/or dried. A drying apparatus can be provided with a heating device, by means of which gas flowing through said heating device can be heated. Gas, e.g., air, that has been heated in this way is then conducted through the absorber, which is regenerated and dried, respectively, by the heated gas. In order to avoid conducting the heated air, which is used for regenerating the absorber, into the solar module, the drying apparatus preferably includes a branch with an outlet opening that branches off between the absorber and the connection for connecting a solar module, which branch connects to the exterior of the drying device. Such a branch has preferably arranged therein a valve, which will be opened when heated air flows through the absorber for the purpose of regeneration, and which will be closed when non-heated air, by means of which the solar module is to be flushed, flows through the absorber. Preferably, an additional valve is arranged between the branch and the connection for a solar module, said valve being closed when heated air flows through the absorber for the purpose of regeneration, and opened when cold air, which has been dried by the absorber, is to be conducted into the solar module. Downstream of the outlet opening, an additional filter can be provided.

The heating device may be, for example, a solar thermal collector, a vacuum collector tube and/or an electric heater, and can include a heating element. It is also possible to provide at least one additional heating device, which heats the absorber itself during regeneration, directly on or in the absorber. Also in this case, heating can be effected by solar energy or by electrical energy.

According to one embodiment, the drying apparatus is provided with a bypass conduit by means of which air flowing into the drying apparatus through a gas inlet can be conducted past the heating device into the absorber. This can be especially beneficial in cases where the heating device works with solar energy or cannot easily be cooled down.

The bypass conduit has preferably arranged therein a valve by means of which the air current through the bypass conduit can be controlled. In addition, a valve, by means of which the flow of gas into the heating device can be controlled, may be provided between the branch of the bypass conduit and the inlet opening of the heating device.

The preferred drying apparatus can be operated in two modes: in a drying mode, in which a solar module is flushed with dried air, and in the regeneration mode, in which the absorber is regenerated and/or dried.

In the preferred drying mode, the gas, preferably air, which flows through an inlet opening into the drying apparatus or is pumped into the drying apparatus, is first conducted through an optional filter, for example a dust filter. Subsequently, the air flows through the non-heated heating device or through the bypass conduit, bypassing said heating device, so as to flow then through an inlet opening into the absorber. If such a bypass conduit is provided in the drying apparatus, the valve which may be provided upstream of the inlet of the heating device is preferably closed in the drying mode, and the valve in the bypass conduit is opened.

After having flowed through the absorber, the air exits the absorber through an outlet opening and enters the solar module to be dried through the open, optional second valve and the connection.

In the preferred regeneration mode, air is again pumped into the apparatus through an inlet opening and an optional filter, said air flowing first through the heating device and, subsequently, through the absorber. If a bypass conduit is here provided, the valve, which is preferably arranged in the bypass conduit, is closed, whereas the valve, which is preferably arranged upstream of the inlet of the heating device, is open. Preferably, an outlet opening is provided, via a branch and a valve, between the outlet of the absorber and the connection used for connecting a solar module. In the regeneration mode, this valve is open so that warm air flowing through the absorber can flow through the valve and out of the outlet opening. A valve arranged between the branch and the connection for the solar module would be closed in this case so as to prevent the heated air from flowing into the solar module.

The drying and the regeneration mode are preferably executed alternately, e.g. in a day and night cycle.

For ensuring that there is flow, the drying apparatus is preferably provided with a blower or a fan. This blower or fan can be arranged immediately downstream of the inlet opening or immediately downstream of a filter following the inlet opening.

Silica gel is particularly suitable for being used as a sorbent in the absorber. The gas used for drying and regeneration is preferably air. Other suitable sorbents and gases can alternatively be used.

The disclosure also includes a method of drying a solar module, which can be executed by means of the drying apparatus according to the present invention. In a preferred embodiment of the method, in one step, gas, preferably air, having a first temperature is conducted through at least one absorber into a solar module. In this step, the solar module can be flushed by air that has been dried by the absorber, i.e. this step corresponds to the drying mode.

In another step, viz. the regeneration step, gas, preferably air, is first heated in a heating device to a second temperature, which is higher than the above-mentioned first temperature. Subsequently, the heated air is conducted through the absorber so as to dry and/or regenerate the same. This step corresponds to the regeneration mode.

Preferably, the two above-described steps of flushing with dry air and regenerating the absorber are executed alternatively, so that, when air has been dried by the absorber, the absorber will be regenerated. It is then again ready for use so that additional air can be dried.

As in the above-described apparatus, the air can be heated in the method according to the present invention by making use of e.g. solar thermal collectors, vacuum collector tubes and/or electric heaters. It is also possible to directly heat the absorber itself in the regeneration step. For increasing the service life of the components used, the air is preferably filtered by a filter, e.g. a dust filter, before it enters the heating device and the absorber, respectively.

FIG. 1 shows a drying apparatus according an embodiment used for drying a solar module 1. The solar module may be, for example, a Flatcon® concentrator module produced by the firm of Concentrix Solar GmbH. In this drying apparatus embodiment, air is pumped through a dust filter 3 into the apparatus, making use of a pump 2, a blower 2 or a fan 2, or other suitable gas propelling or moving device for causing or ensuring the airflow. The blower 2 is preferably arranged immediately downstream of the dust filter 3, directly behind the dust filter 3 when seen in the airflow direction. The drying apparatus is shown in FIG. 1 in the condition in which the solar module 1 is flushed with dried air. To this end, the air is conducted downstream of the blower 2 into an absorber 6 through a valve 5 arranged in a bypass conduit 4 and through the bypass conduit 4. After having flowed through the absorber 6, the air flows through a valve 7 and the connection 8 into the solar module 1. A flow of air through the heating device 9 is preferably prevented by closing the valve 10, which is arranged upstream of the inlet of the heating device. The valve 11, which is closed during flushing with dry air, additionally prevents the air that has flowed through the absorber 6 from escaping through the outlet 12. During flushing with dry air, the air flows in the drying apparatus and its conduit, first through the inlet opening 13, then through the dust filter 3, and then through the blower 2. Subsequently, the air flows through the valve 5 arranged in the bypass conduit 4 and through the bypass conduit 4, whereupon the air flows through the absorber 6 and the valve 7 and through the outlet opening 8 into the solar module 1.

Figure 2:
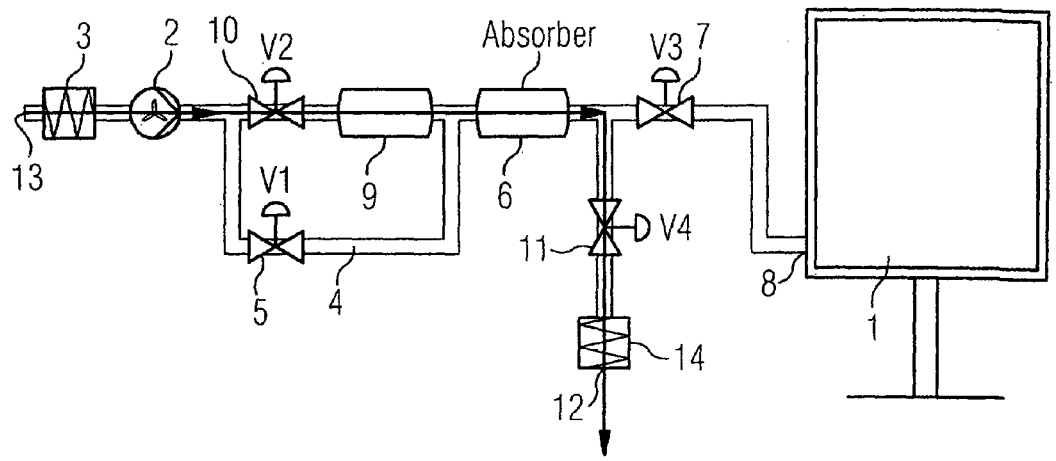
FIG. 2 shows a drying apparatus according to the present invention during regeneration of the absorber.

FIG. 2 shows now the apparatus during regeneration of the absorber. Identical reference numerals correspond here to the same elements as in FIG. 1. During regeneration, the air is pumped through the inlet opening 13 into the apparatus by means of the blower 2 or other air propelling or moving device. In the course of this process, the air flows first through the filter 3, then through the blower 2 and subsequently through the valve 10, which is now open. The valve 5 arranged in the bypass conduit 4 is now closed. Downstream of the valve 10, the air now flows through the heating device 9, where it is heated. The heated air then flows through the absorber 6 to, which is regenerated and/or dried when said air is flowing therethrough. After having passed through the absorber 6, the air flows through valve 12, which is now open, and preferably through an additional dust filter 14 through the outlet 12 to the outside. The valve 7 arranged upstream of the connection 8 is closed and prevents the heated air from flowing into the solar module 11.

By opening and closing the valves 5, 7, 10 and 11, the drying apparatus can be switched over between the condition in which the solar module is flushed with dry air and the condition in which the absorber is regenerated.

As used herein, the terms "front," "back," and/or other terms indicative of direction are used herein for convenience and to depict relational positions and/or directions between the parts of the embodiments. It will be appreciated that certain embodiments, or portions thereof, can also be oriented in other positions.

While an illustrative embodiment of the invention has been disclosed herein, it will be appreciated that numerous modifications and other embodiments may be devised by those of ordinary skill in the art. Therefore, it will be understood that the appended claims are intended to cover all such modifications and embodiments that come within the spirit and scope of the present invention.

The invention claimed is:

1. A solar module drying apparatus, comprising:
an absorber configured for drying a gas and having an absorber inlet and an absorber outlet for the gas flowing therethrough;
a first heating device configured to directly heat the absorber during solar module regeneration;
a second heating device configured for heating the gas entering the absorber inlet to pass through the absorber for drying the absorber;
a bypass conduit connected for directing the gas to the absorber inlet, bypassing the second heating device; and
a solar module connection that is connected to a solar module for directing the dried gas from the absorber to the solar module.

2. The drying apparatus of claim 1, wherein the second heating device has a heating inlet and a heating outlet for the gas flowing therethrough, the absorber outlet is in gas-conducting communication with the connection, and the heating outlet is in gas-conducting communication with the absorber inlet.

3. The drying apparatus of claim 1, further comprising:
a first outlet connected downstream of the absorber outlet and upstream of the connection and configured for releasing the gas from the drying apparatus to the exterior; and
a first outlet valve member connected with the absorber outlet and configured for selectively directing the gas from the absorber to the first outlet.

4. The drying apparatus of claim 3, wherein the first outlet valve member comprises a first valve disposed between the absorber and the first outlet, and a second valve disposed between a branch and the connection for controlling the flow of gas from the connection.

5. The drying apparatus of claim 1, further comprising a bypass valve member connected for controlling the flow of gas through the bypass conduit.

6. The drying apparatus of claim 5, wherein the bypass valve member comprises a valve disposed for controlling the flow of gas through the bypass conduit, and another valve disposed upstream of the inlet of the second heating element and configured for controlling the flow of gas into the second heating element.

7. The drying apparatus of claim 5, further comprising:
an outlet connected downstream of the absorber outlet and upstream of the connection and configured for releasing the gas from the drying apparatus to the exterior;

an outlet valve member connected with the absorber outlet and configured for selectively directing the gas from the absorber to the outlet; and a controller associated with the valve members for alternately operating the valve members in:
- a first mode, in which the valve members are adapted to direct the gas through the bypass conduit, the absorber, and the connection for flushing the solar module with air dried by the absorber, and
- in a second mode, in which the valve members are adapted to direct the gas through the second heating device, the absorber, and the outlet, for regenerating the absorber.

8. The drying apparatus of claim 1, further comprising a gas moving device configured for propelling the gas through the drying apparatus.

9. The drying apparatus of claim 1, further comprising a dust filter connected at an inlet into the drying device or the outlet.

10. The drying apparatus of claim 1, wherein the second heating device comprises a solar thermal collector, a vacuum collector tube, or an electric heater.

11. The drying apparatus of claim 1, wherein the second heating device is disposed on the absorber.

12. The drying apparatus of claim 1, wherein the absorber contains silica gel for drying the gas.

13. A solar module system, comprising the drying apparatus of claim 12 and the solar module connected to the connection for receiving the dried gas from the absorber.

14. The drying apparatus of claim 1, wherein the first heating device is disposed directly on or in the absorber.

15. The drying apparatus of claim 1, wherein the second heating device is located upstream of the absorber to heat the gas, which is then conducted through the absorber.

* * * * *